United States Patent
Zheng et al.

(10) Patent No.: US 10,879,931 B2
(45) Date of Patent: Dec. 29, 2020

(54) METHOD AND APPARATUS FOR GENERATING LOW-DENSITY PARITY-CHECK CODE BASIS MATRIX

(71) Applicant: HUAWEI TECHNOLOGIES CO., LTD., Guangdong (CN)

(72) Inventors: Chen Zheng, Shanghai (CN); Yuejun Wei, Shanghai (CN); Liang Ma, Shanghai (CN); Xin Zeng, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 44 days.

(21) Appl. No.: 16/251,182

(22) Filed: Jan. 18, 2019

(65) Prior Publication Data

US 2019/0173494 A1 Jun. 6, 2019

Related U.S. Application Data

(63) Continuation of application No. PCT/CN2016/090646, filed on Jul. 20, 2016.

(51) Int. Cl.
*H03M 13/11* (2006.01)
*H03M 13/00* (2006.01)

(52) U.S. Cl.
CPC ........ *H03M 13/116* (2013.01); *H03M 13/118* (2013.01); *H03M 13/1157* (2013.01);
(Continued)

(58) Field of Classification Search
CPC ............. H03M 13/116; H03M 13/635; H03M 13/6516; H03M 13/1157; H03M 13/1177; H03M 13/118
See application file for complete search history.

(56) References Cited

U.S. PATENT DOCUMENTS

| 7,516,390 | B2 | 4/2009 | Shen et al. |
| 8,291,283 | B1 | 10/2012 | Rad et al. |

(Continued)

FOREIGN PATENT DOCUMENTS

| CN | 101373976 A | 2/2009 |
| CN | 101741396 A | 6/2010 |

(Continued)

OTHER PUBLICATIONS

J. Kang, P. Fan, Z. Cao, et al., "Flexible Construction of Irregular Partitioned Permutation LDPC Codes With Low Error Floors". IEEE Communications Letters, 2005, 9(6): 534-536.

(Continued)

*Primary Examiner* — Thien Nguyen
(74) *Attorney, Agent, or Firm* — Fish & Richardson P.C.

(57) ABSTRACT

The present disclosure relates to methods and apparatuses for generating a low-density parity-check code basis matrix. One example method includes obtaining a low-density parity-check code mother matrix, and generating a $1^{st}$ matrix to a $q^{th}$ matrix one by one, where q is a preset positive integer. A $P^{th}$ matrix in the $1^{st}$ matrix to the $q^{th}$ matrix is generated in the following manner: selecting a to-be-replaced matrix element in a $(P-1)^{th}$ matrix, where the to-be-replaced matrix element is a matrix element having a value that is not −1 in the $(P-1)^{th}$ matrix, determining a $P^{th}$ shift factor corresponding to the to-be-replaced matrix element, and replacing the to-be-replaced matrix element in the $(P-1)^{th}$ matrix with the $P^{th}$ shift factor to obtain the $P^{th}$ matrix whose cycle length property is better than a cycle length property of the $(P-1)^{th}$ matrix.

6 Claims, 3 Drawing Sheets

(52) U.S. Cl.
CPC ..... *H03M 13/1177* (2013.01); *H03M 13/635* (2013.01); *H03M 13/6516* (2013.01)

(56) References Cited

U.S. PATENT DOCUMENTS

| | | | |
|---|---|---|---|
| 2005/0144549 A1* | 6/2005 | Kim | H03M 13/1102 714/752 |
| 2007/0162815 A1 | 7/2007 | El-Khamy et al. | |
| 2010/0058139 A1 | 3/2010 | Wang et al. | |
| 2010/0257425 A1* | 10/2010 | Yue | H03M 13/033 714/752 |
| 2011/0283159 A1* | 11/2011 | Yuan | H03M 13/116 714/752 |
| 2011/0289375 A1 | 11/2011 | Jiang et al. | |
| 2013/0086445 A1 | 4/2013 | Yedidia et al. | |
| 2016/0149590 A1 | 5/2016 | Bao | |

FOREIGN PATENT DOCUMENTS

| | | |
|---|---|---|
| CN | 101820288 A | 9/2010 |
| CN | 102075198 A | 5/2011 |
| CN | 103152056 A | 6/2013 |
| CN | 103731158 A | 4/2014 |
| CN | 103843252 A | 6/2014 |
| CN | 104821831 A | 8/2015 |
| JP | 2009522961 A | 6/2009 |
| JP | 2010057177 A | 3/2010 |
| JP | 2014522139 A | 8/2014 |
| WO | 2010035501 A1 | 4/2010 |
| WO | 2012159304 A1 | 11/2012 |

OTHER PUBLICATIONS

Richardson T.,"Error floors of LDPC codes"Proceedings of the annual Allerton conference on communication control and computing. The University; 1998, 2003, 41(3): 1426-1435.
Gallager R G., "Low-density parity-check codes". Information Theory, IRE Transactions on, 1962, pp. 21-28.
International Search Report and Written Opinion issued in International Application No. PCT/CN2016/090646 dated Apr. 4, 2017, 18 pages.
Dong-liang et al., "Construction of LDPC Code based on Permutation Matrices Optimization," Communications Technologies, Mar. 2011, 4 pages (with English abstract).
Pinyi et al., "Block-by-block construction method for low complexity quasi-cyclic low density parity check codes," Science of China: Information Science, vol. 40 Issue 9, 2010, 12 pages (with English abstract).
Baldi et al., "A class of invertible circulant matrices for QC-LDPC codes," International Symposium on Information Theory and its Applications, ISITA 2008, Auckland, New Zealand, Dec. 7-10, 2008, 6 pages.
Lijun et al., "Construction of Type-II QC LDPC Codes Based on Perfect Cyclic Difference Set," Chinese Journal of Electronics, vol. 24, No. 1, Jan. 2015, 6 pages.
Office Action issued in Chinese Application No. 201680073765.5 dated Feb. 3, 2020, 11 pages (with English translation).
Beermann et al., "Highly Flexible Design of Multi-Rate Multi-Length Quasi-Cyclic LDPC Codes," Proceedings from IEEE 8th International Symposium on Turbo Codes and Iterative Information Processing (ISTC), Aug. 18, 2014, XP032682409, pp. 37-41.
Extended European Search Report issued in European Application No. 16909178.2 dated May 31, 2019, 10 page.
Jiang et al., "An Improved Variable Length Coding Scheme using Sructured LDPC codes", Proceedings from IEEE Internatonal Conference on Wireless Communications and Signal Processing, WCSP 2010, Oct. 21, 2010, XP031800170, pp. 1-5.
Tian et al., "Construction of Irregular LDPC Codes with Low Error Floors," Proceedings from IEEE International conference on Communications, ICC 2003, vol. 5, May 11, 2003, XP010643022, pp. 3125-3129.
Vukobratovic, "ACE Spectrum of LDPC Codes and Generalized ACE Design," Proceedings from IEEE International conference on Communications, ICC 2007, Jun. 24, 2007, XP031125747, pp. 665-670.
Office Action issued in Japanese Application No. 2019-502091 dated Feb. 18, 2020, 6 pages. (with English translation).
Office Action issued in Chinese Application No. 201680073765.5 dated Nov. 16, 2020, 9 pages.

* cited by examiner

METHOD AND APPARATUS FOR GENERATING LOW-DENSITY PARITY-CHECK CODE BASIS MATRIX

CROSS-REFERENCE TO RELATED APPLICATIONS

This application is a continuation of International Application No. PCT/CN2016/090646, filed on Jul. 20, 2016, the disclosure of which is hereby incorporated by reference in its entirety.

TECHNICAL FIELD

This application relates to the field of wireless communications, and in particular, to a method and an apparatus for generating a low-density parity-check code basis matrix.

BACKGROUND

A quasi-cyclic low-density parity-check code (quasi cycle low density parity check code, QC-LDPC for short) is a type of linear block code with a sparse parity check matrix. Because of good performance approaching a Shannon limit and characteristics of a flexible structure and low decoding complexity, the QC-LDPC can be widely used in various communications systems.

When the QC-LDPC is used for data transmission, a QC-LDPC parity check matrix needs to be first constructed for a wireless communications device. In a wireless communications system, radio resource blocks (resource block, RB for short) of different sizes may be allocated to the wireless communications device depending on different transmission requirements. For RBs of different sizes, QC-LDPC code lengths that can be supported by the wireless communications device are different. To enable the wireless communications device to support QC-LDPCs of different code lengths, a basis matrix including m rows and n columns of matrix elements may be generated in advance, where m=n−k, k indicates a length of an information sequence in the QC-LDPC, values of m, n, and k are all positive integers, and a lifting factor corresponding to each QC-LDPC code length is preconfigured. After a QC-LDPC code length is determined, a data transmission device first obtains a lifting factor corresponding to the code length, and then expands the basis matrix by using the lifting factor, so as to obtain a parity check matrix corresponding to the code length. In this manner, for different QC-LDPC code lengths, different parity check matrices may be obtained on a basis of the basis matrix, so that the wireless communications device can support QC-LDPCs of different code lengths.

However, when a plurality of different lifting factors are used to expand a same basis matrix, it is usually very difficult to ensure that each parity check matrix obtained has a good cycle length property. A relatively poor cycle length property of some parity check matrices may cause a relatively high error floor of such parity check matrices, and reliability of data transmission performed by using a QC-LDPC with a corresponding code length is property affected.

SUMMARY

This application provides a method and an apparatus for generating a low-density parity-check code basis matrix, so as to mitigate a problem of a relatively high error floor of a basis matrix obtained based on some lifting factors.

According to a first aspect, this application provides a method for generating a low-density parity-check code basis matrix. The method includes: obtaining a low-density parity-check code mother matrix; and generating a $1^{st}$ matrix to a $q^{th}$ matrix one by one, where q is a preset positive integer; and a $P^{th}$ matrix in the $1^{st}$ matrix to the $q^{th}$ matrix is generated in the following manner: selecting a to-be-replaced matrix element in a $(P-1)^{th}$ matrix, where the to-be-replaced matrix element is a matrix element having a value that is not −1 in the $(P-1)^{th}$ matrix; determining a $P^{th}$ shift factor corresponding to the to-be-replaced matrix element; and replacing the to-be-replaced matrix element in the $(P-1)^{th}$ matrix with the $P^{th}$ shift factor to obtain the $P^{th}$ matrix, where a cycle length property of the $P^{th}$ matrix is better than a cycle length property of the $(P-1)^{th}$ matrix; the cycle length property of the $P^{th}$ matrix is determined by cycle length properties of matrices included in a $P^{th}$ matrix set, and the $P^{th}$ matrix set includes matrices obtained by expanding the $P^{th}$ matrix based on preset lifting factors; and the cycle length property of the $(P-1)^{th}$ matrix is determined by cycle length properties of matrices included in a $(P-1)^{th}$ matrix set, and the $(P-1)^{th}$ matrix set includes matrices obtained by expanding the $(P-1)^{th}$ matrix based on preset lifting factors.

When the basis matrix is generated by using the method according to this aspect, the cycle length properties of the matrices obtained through lifting based on all lifting factors are considered for setting of the shift factor of the basis matrix, so that an average cycle length property of the parity check matrices obtained by expanding the basis matrix based on the preset lifting factors is relatively good. This ensures that the parity check matrix obtained based on each preset lifting factor has a relatively good cycle length property, so that error floors of the parity check matrices obtained by expanding the basis matrix based on all preset lifting factors are relatively low, thereby avoiding a relatively high error floor of some parity check matrices.

With reference to the first aspect, in a first possible implementation of the first aspect, that a cycle length property of the $P^{th}$ matrix is better than a cycle length property of the $(P-1)^{th}$ matrix includes: quantities of 4-cycles to L-cycles with an approximate cycle extrinsic message degree ACE being less than a first preset value in the $P^{th}$ matrix set are respectively the same as quantities of 4-cycles to L-cycles with the ACE being less than the first preset value in the $(P-1)^{th}$ matrix set, quantities of 4-cycles to L-cycles in the $P^{th}$ matrix set are respectively the same as quantities of 4-cycles to L-cycles in the $(P-1)^{th}$ matrix set, and (L+2)-cycles with the ACE being less than a second preset value in the $P^{th}$ matrix set are fewer than (L+2)-cycles with the ACE being less than the second preset value in the $(P-1)^{th}$ matrix set, where L is an even number less than a preset value.

With reference to the first aspect, in a second possible implementation of the first aspect, that a cycle length property of the $P^{th}$ matrix is better than a cycle length property of the $(P-1)^{th}$ matrix includes: quantities of 4-cycles to L-cycles in the $P^{th}$ matrix set are respectively the same as quantities of 4-cycles to L-cycles in the $(P-1)^{th}$ matrix set, quantities of 4-cycles to (L+2)-cycles with an approximate cycle extrinsic message degree ACE being less than a second preset value in the $P^{th}$ matrix set are respectively the same as quantities of 4-cycles to (L+2)-cycles with the ACE being less than the second preset value in the $(P-1)^{th}$ matrix set, and (L+2)-cycles in the $P^{th}$ matrix set are fewer than (L+2)-cycles in the $(P-1)^{th}$ matrix set, where L is an even number less than a preset value.

With reference to any one of the first aspect or the first to the second implementations of the first aspect, in a third possible implementation of the first aspect, the determining a $P^{th}$ shift factor corresponding to a to-be-replaced matrix element in the $(P-1)^{th}$ matrix includes: obtaining a $P_k^{th}$ shift factor corresponding to the to-be-replaced matrix element; replacing the to-be-replaced matrix element in the $(P-1)^{th}$ matrix with the $P_k^{th}$ shift factor, to generate a $P^{th}$ matrix; and if a cycle length property of the $P_k^{th}$ matrix is better than the cycle length property of the $(P-1)^{th}$ matrix, using the $P_k^{th}$ shift factor as the $P^{th}$ shift factor.

With reference to the third implementation of the first aspect, in a fourth possible implementation of the first aspect, the method further includes: if the cycle length property of the $P_k^{th}$ matrix is not better than the cycle length property of the $(P-1)^{th}$ matrix, obtaining a $P_{k+1}^{th}$ shift factor corresponding to the to-be-replaced matrix element; replacing the to-be-replaced matrix element in the $(P-1)^{th}$ matrix with the $P_{k+1}^{th}$ shift factor, to generate a $P_{k+1}^{th}$ matrix; and if a cycle length property of the $P_{k+1}^{th}$ matrix is better than the cycle length property of the $(P-1)^{th}$ matrix, using the $P_{k+1}^{th}$ shift factor as the $P^{th}$ shift factor.

According to a second aspect, this application further provides an apparatus for generating a low-density parity-check code basis matrix, where the apparatus may include units configured to perform the method steps in the foregoing first aspect and the implementations of the first aspect.

According to a third aspect, this application further provides a generation device, where the generation device may include components such as a processor, a memory, and a communications interface, and the processor may be configured to perform all or some method steps in the foregoing first aspect and the implementations of the first aspect.

In this implementation, error floors of the parity check matrices obtained by expanding the basis matrix based on all preset lifting factors are relatively low, thereby avoiding a relatively high error floor of some parity check matrices.

When the basis matrix is generated by using the method provided in this application, the average cycle length property of the parity check matrices obtained by expanding the finally generated basis matrix based on the preset lifting factors is relatively good. This can avoid a problem that a cycle length property of a parity check matrix obtained based on a preset lifting factor is relatively poor, and ensure that the parity check matrix obtained based on each preset lifting factor has a relatively good cycle length property, thereby avoiding a relatively high error floor of some parity check matrices.

BRIEF DESCRIPTION OF DRAWINGS

To describe the technical solutions in this application more clearly, the following briefly describes the accompanying drawings required for describing the embodiments. Apparently, a person of ordinary skill in the art may derive other drawings from these accompanying drawings without creative efforts.

DESCRIPTION OF EMBODIMENTS

Figure 1:
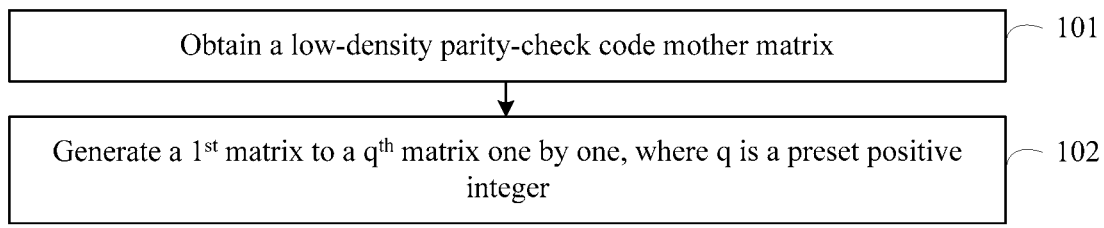
FIG. 1 is a schematic flowchart of an embodiment of a method for generating a low-density parity-check code basis matrix in this application.

In the embodiments of this application, a cycle in a matrix is a cycle in a Tanner graph corresponding to the matrix when the matrix is used as a low-density parity-check code parity check matrix. An L-cycle is a cycle that includes L nodes. From a feature of the Tanner graph, it can be learned that L is an even number, a minimum value of L is 4, and a maximum value of L is determined by a quantity of rows in the matrix, a quantity of columns in the matrix, and complexity of the matrix. It should be noted that because a cycle with two nodes does not exist in the Tanner graph, it can be considered that a quantity of 2-cycles is 0.

In the embodiments of this application, a matrix set indicates a set of matrices obtained by using a matrix as a basis matrix and expanding the matrix based on various preset lifting factors. A quantity of matrices included in the matrix set is the same as a quantity of preset lifting factors, and each matrix in the matrix set is uniquely corresponding to one lifting factor.

In the embodiments of this application, a cycle length property of a matrix set may be a total quantity of cycles that meet a preset condition in all the matrices included in the matrix set. A superior cycle length property indicates that the total quantity of cycles meeting the preset condition is relatively small. The cycle length property of the matrix set is also a cycle length property of a matrix corresponding to the matrix set.

For example, a set of matrices obtained by expanding a matrix A based on preset lifting factors is a matrix set A, and a set of matrices obtained by expanding a matrix B based on the preset lifting factors is a matrix set B. A cycle length property of the matrix set A is a total quantity of cycles that meet a preset condition in matrices included in the matrix set A, and a cycle length property of the matrix set B is a total quantity of cycles that meet the preset condition in matrices included in the matrix set B. If the total quantity of cycles that meet the condition in the matrices included in the matrix set A is less than the total quantity of cycles that meet the preset condition in the matrices included in the matrix set B, it may be considered that the cycle length property of the matrix set A is better than the cycle length property of the matrix set B.

If a total quantity of 4-cycles in the matrices included in the matrix set A is less than a total quantity of 4-cycles in the matrices included in the matrix set B, it may be considered that the cycle length property of the matrix set A is better than the cycle length property of the matrix set B. However, in actual use, it is very likely that the total quantity of 4-cycles in the matrices included in the matrix set A is the same as the total quantity of 4-cycles in the matrices included in the matrix set B. Therefore, the preset condition may be:

If quantities of 4-cycles to L-cycles with an approximate circle extrinsic message degree (approximate circle EMD, ACE for short) being less than a first preset value in the matrix set A are respectively the same as quantities of 4-cycles to L-cycles with the ACE being less than the first preset value in the matrix set B, quantities of 4-cycles to L-cycles in the matrix set A are respectively the same as quantities of 4-cycles to L-cycles in the matrix set B, and (L+2)-cycles with the ACE being less than a preset value B in the matrix set A are fewer than (L+2)-cycles with the ACE being less than a second preset value in the matrix set B, it may be considered that the cycle length property of the matrix A is better than the cycle length property of the matrix B.

Alternatively, if quantities of 4-cycles to L-cycles in the matrix set A are respectively the same as quantities of 4-cycles to L-cycles in the matrix set B, quantities of 4-cycles to (L+2)-cycles with an approximate cycle extrinsic message degree ACE being less than a second preset value in the matrix set A are respectively the same as quantities of 4-cycles to (L+2)-cycles with the ACE being less than the second preset value in the matrix set B, and (L+2)-cycles in the matrix set A are fewer than (L+2)-cycles in the matrix set B, it may also be considered that the cycle length property of the matrix A is better than the cycle length property of the matrix B.

That quantities of 4-cycles to L-cycles with the ACE being less than a first preset value in the matrix set A are respectively the same as quantities of 4-cycles to L-cycles with the ACE being less than the first preset value in the matrix set B may indicate that: for any even number X that is not less than 4 and not greater than L, a quantity of X-cycles with the ACE being less than Y in the matrix set A is the same as a quantity of X-cycles with the ACE being less than Y in the matrix set B, where Y is a positive integer. A value of Y is determined by a value of X. Usually, the value of Y is half of the value of X. That quantities of 4-cycles to L-cycles in the matrix set A are respectively the same as quantities of 4-cycles to L-cycles in the matrix set B may indicate that: for any even number X that is not less than 4 and not greater than L, a quantity of X-cycles in the matrix set A is the same as a quantity of X-cycles in the matrix set B.

For example, under the preset condition that there are relatively few 4-cycles with the ACE being less than 2, if a total quantity of 4-cycles with the ACE<2 in the matrix set A is less than a total quantity of 4-cycles with the ACE<2 in the matrix set B, it may be considered that the cycle length property of the matrix A is better than the cycle length property of the matrix B. For another example, under the preset condition that a quantity of 4-cycles is relatively small, if a total quantity of 4-cycles in the matrix set A is less than a total quantity of 4-cycles in the matrix set B, it may be considered that the cycle length property of the matrix A is better than the cycle length property of the matrix B.

The value of L may be extremely large in actual use, and a very large value of L makes a process of comparing cycle length properties of the matrix set A and the matrix set B complicated. Therefore, in the actual use, a limit value may be set. When L is equal to the limit value, if the quantities of the 4-cycles to the L-cycles in the matrix set A are respectively the same as the quantities of the 4-cycles to the L-cycles in the matrix set B, and the quantities of the 4-cycles to the L-cycles with the approximate cycle extrinsic message degree ACE being less than the second preset value in the matrix set A are respectively the same as the quantities of the 4-cycles to the L-cycles with the ACE being less than the second preset value in the matrix set B, it may be considered that the cycle length property of the matrix set A is not better than the cycle length property of the matrix set B, and the cycle length property of the matrix set B is not better than the cycle length property of the matrix set A.

In the embodiments of this application, the generation device may be a wireless communications device, a server in a wireless communications system, or another device that is specifically used for generating a basis matrix. A low-density parity-check matrix generated by the generation device is used for data transmission.

Referring to FIG. 1, FIG. 1 is a schematic flowchart of an embodiment of a method for generating a low-density parity-check code basis matrix in this application. The method includes the following steps.

Step 101: Obtain a low-density parity-check code mother matrix.

When generating a basis matrix, a generation device needs to obtain a mother matrix first. Usually, the mother matrix includes m rows and n columns of matrix elements, and a code rate is (n-m)/n. The mother matrix may be generated by the generation device, or may be obtained by the generation device from another device.

For example, the generation device may use, as the mother matrix, an m-row and n-column matrix that is constructed according to a density evolution theory and a PEG method. The code rate of the mother matrix may be (n-m)/n, and values of matrix elements in the matrix are 0 or −1.

Step 102: Generate a $1^{st}$ matrix to a $q^{th}$ matrix one by one, where q is a preset positive integer.

After the mother matrix is obtained, the mother matrix may be used as a $0^{th}$ matrix, and then the $1^{st}$ matrix to the $q^{th}$ matrix may be generated one by one in a preset generation manner, where q is a preset positive integer. A $P^{th}$ matrix in the $1^{st}$ matrix to the $q^{th}$ matrix may be generated on a basis of a $(P-1)^{th}$ matrix, and a cycle length property of the $P^{th}$ matrix is better than a cycle length property of the $(P-1)^{th}$ matrix.

A value of q may be preset based on an actual requirement. A larger value of q indicates a better cycle length property of a parity check matrix obtained by expanding the finally generated basis matrix based on various lifting factors, but larger resource overheads for generating the basis matrix. A smaller value of q indicates smaller resource overheads for generating the basis matrix, but a poorer cycle length property of the parity check matrix generated based on the basis matrix. Therefore, in actual use, the value of q may be determined based on a requirement for cycle length properties of the parity check matrices and a limit on the resource overheads.

Figure 2:
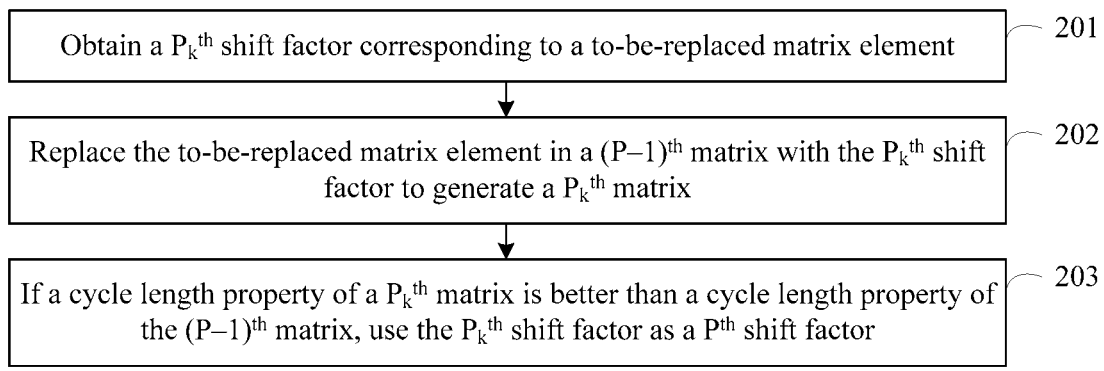
FIG. 2 is a schematic flowchart of an embodiment of a $P^{th}$ matrix generation method in this application.

Referring to FIG. 2, FIG. 2 is a schematic flowchart of an embodiment of a $P^{th}$ matrix generation method in this application. A $P^{th}$ matrix in a $1^{st}$ matrix to a $q^{th}$ matrix may be generated in the following manner.

Step 201: Select a to-be-replaced matrix element in a $(P-1)^{th}$ matrix.

After the $(P-1)^{th}$ matrix is generated, a generation device may first determine the to-be-replaced matrix element in the $(P-1)^{th}$ matrix, where the to-be-replaced matrix element in the $(P-1)^{th}$ matrix may be expressed as a to-be-replaced $(P-1)^{th}$-matrix element. For example, a to-be-replaced $0^{th}$-matrix element indicates the to-be-replaced matrix element in a $0^{th}$ matrix, and a to-be-replaced $5^{th}$-matrix element indicates the to-be-replaced matrix element in a $5^{th}$ matrix.

There may be multiple manners of determining the to-be-replaced $(P-1)^{th}$-matrix element. For example, the generation device may determine, through matrix search, a matrix element with a value not being −1 in the $(P-1)^{th}$ matrix, and then select one of the matrix element with the value not being −1 as the to-be-replaced $(P-1)^{th}$-matrix element. Alternatively, the generation device may directly use the first matrix element with the value not being −1, which is found through matrix search, as the to-be-replaced (P−1)$^{th}$-matrix element.

Step 202: Determine a P$^{th}$ shift factor corresponding to the to-be-replaced matrix element.

After the to-be-replaced (P−1)$^{th}$-matrix element is determined, the generation device may determine a shift factor for the to-be-replaced (P−1)$^{th}$-matrix element. The shift factor generated for the to-be-replaced (P−1)$^{th}$-matrix element may be called a P$^{th}$ shift factor. The P$^{th}$ shift factor can make a cycle length property of the P$^{th}$ matrix better than a cycle length property of the (P−1)$^{th}$ matrix, where the P$^{th}$ matrix is a matrix obtained based on the P$^{th}$ shift factor corresponding to the to-be-replaced matrix element in the (P−1)$^{th}$ matrix. For a manner of determining the P$^{th}$ shift factor, refer to an embodiment corresponding to FIG. 3.

Step 203: Replace the to-be-replaced matrix element in the (P−1)$^{th}$ matrix with the P$^{th}$ shift factor to obtain the P$^{th}$ matrix.

After the P$^{th}$ shift factor is determined, the to-be-replaced matrix element in the (P−1)$^{th}$ matrix may be replaced with the P$^{th}$ shift factor to obtain the P$^{th}$ matrix.

When the basis matrix is generated by using the method provided in this embodiment, an average cycle length property of parity check matrices obtained by expanding the finally generated basis matrix based on the preset lifting factors is relatively good. This can avoid a problem that a cycle length property of a parity check matrix obtained based on a preset lifting factor is relatively poor, and ensure that the parity check matrix obtained based on each preset lifting factor has a relatively good cycle length property. Therefore, an error floor of the parity check matrix obtained by expanding the basis matrix based on all preset lifting factors is relatively low, thereby avoiding a relatively high error floor of some parity check matrices.

Figure 3:
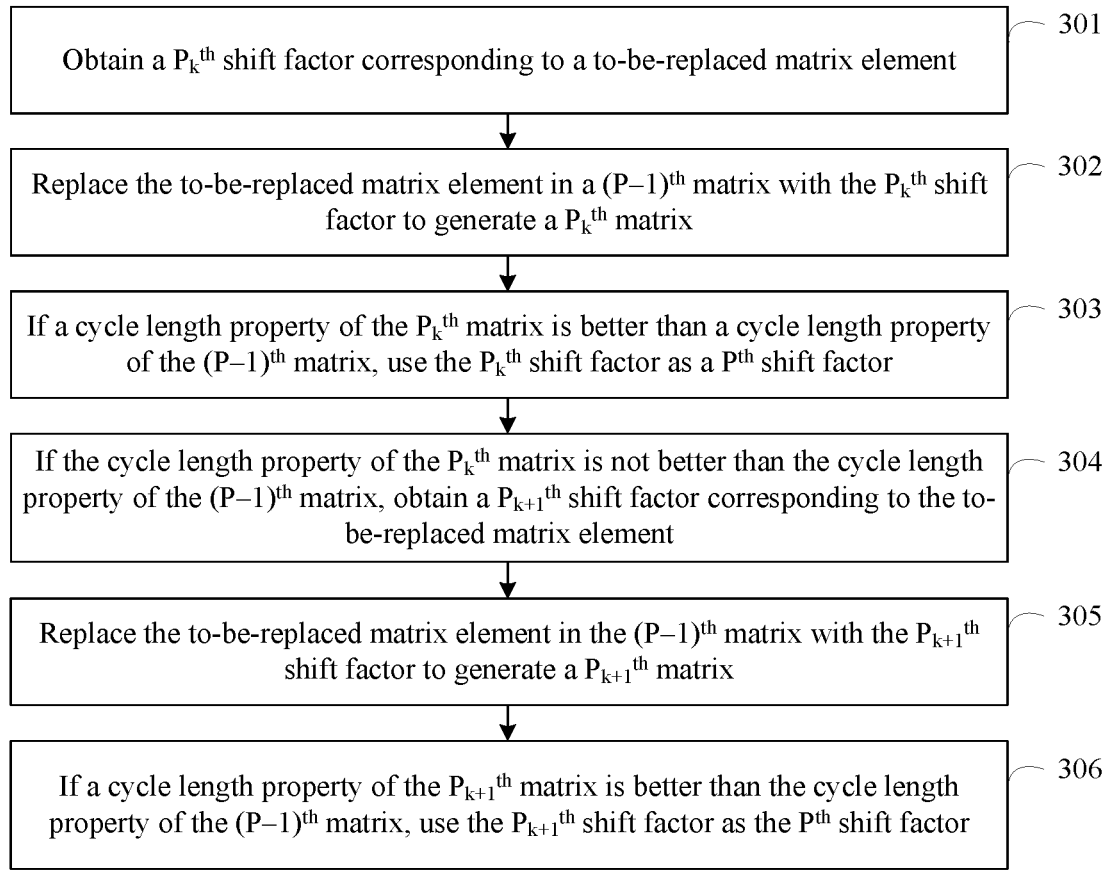
FIG. 3 is a schematic flowchart of an embodiment of a $P^{th}$ shift factor determining method in this application.

Referring to FIG. 3, FIG. 3 is a schematic flowchart of an embodiment of a P$^{th}$ shift factor determining method in this application. The P$^{th}$ shift factor in the foregoing embodiment may be determined in the following manner.

Step 301: Obtain a $P_k^{th}$ shift factor corresponding to the to-be-replaced matrix element.

There are a plurality of manners of obtaining the $P_k^{th}$ shift factor. The generation device may generate, within a preset range of a generated random number, the random number as the $P_k^{th}$ shift factor, or may select, according to a preset selection rule, one of a plurality of preset candidate shift factors as the $P_k^{th}$ shift factor.

It should be noted that the generation device may obtain the $P_k^{th}$ shift factor when a cycle length property of a $P_{k-1}^{th}$ matrix is not better than the cycle length property of the (P−1)$^{th}$ matrix, where the $P_{k-1}^{th}$ matrix is obtained by replacing the to-be-replaced matrix element in the (P−1)$^{th}$ matrix with a $P_{k-1}^{th}$ shift factor.

Step 302: Replace the to-be-replaced matrix element in the (P−1)$^{th}$ matrix with the $P_k^{th}$ shift factor, to generate a $P_k^{th}$ matrix.

After the $P_k^{th}$ shift factor is generated, the generation device may replace the to-be-replaced matrix element in the (P−1)$^{th}$ matrix with the $P_k^{th}$ shift factor to obtain the $P_k^{th}$ matrix.

Step 303: If a cycle length property of the $P_k^{th}$ matrix is better than a cycle length property of the (P−1)$^{th}$ matrix, use the $P_k^{th}$ shift factor as the P$^{th}$ shift factor.

After the $P_k^{th}$ matrix is generated, comparison may be performed to determine whether a cycle length property of a $P_k^{th}$ matrix set is better than a cycle length property of a (P−1)$^{th}$ matrix set. If the cycle length property of the $P_k^{th}$ matrix set is better than the cycle length property of the (P−1)$^{th}$ matrix set, the $P_k^{th}$ shift factor is the P$^{th}$ shift factor.

For example, a value of L is 6. If a quantity of 4-cycles with the ACE being less than 2 in the $P_k^{th}$ matrix set is less than a quantity of 4-cycles with the ACE being less than 2 in the (P−1)$^{th}$ matrix set, it may be considered that the cycle length property of the $P_k^{th}$ matrix set is better than the cycle length property of the (P−1)$^{th}$ matrix set, and further the $P_k^{th}$ shift factor may be used as the P$^{th}$ shift factor.

For example, the value of L is still 6. If compared between the $P_k^{th}$ matrix set and the (P−1)$^{th}$ matrix set, quantities of 4-cycles with the ACE being less than 2 are the same, quantities of 4-cycles are the same, but 6-cycles with the ACE being less than 3 in the $P_k^{th}$ matrix set are fewer than 6-cycles with the ACE being less than 3 in the (P−1)$^{th}$ matrix set, it may also be considered that the cycle length property of the $P_k^{th}$ matrix is better than the cycle length property of the (P−1)$^{th}$ matrix, and further the $P_k^{th}$ shift factor may be used as the P$^{th}$ shift factor.

For example, the value of L is still 6. If compared between the $P_k^{th}$ matrix set and the (P−1)$^{th}$ matrix set, quantities of 4-cycles with the ACE being less than 2 are the same, quantities of 4-cycles are the same, quantities of 6-cycles with the ACE being less than 3 are the same, but 6-cycles in the $P_k^{th}$ matrix set are fewer than 6-cycles in the (P−1)$^{th}$ matrix set, it may also be considered that the cycle length property of the $P_k^{th}$ matrix is better than the cycle length property of the (P−1)$^{th}$ matrix, and further the $P_k^{th}$ shift factor may be used as the P$^{th}$ shift factor.

In this embodiment, the P$^{th}$ shift factor corresponding to the to-be-replaced matrix element may be determined to generate the $P_k^{th}$ matrix.

Because the $P_k^{th}$ shift factor is a shift factor that is randomly generated by the generation device within a preset random number range, or may be a shift factor that is randomly selected by the generation device from preset shift factors, the cycle length property of the $P_k^{th}$ matrix is not necessarily better than the cycle length property of the (P−1)$^{th}$ matrix.

Therefore, if the cycle length property of the $P_k^{th}$ matrix is not better than the cycle length property of the (P−1)$^{th}$ matrix, the following steps may be further included after step 303.

Step 304: If the cycle length property of the $P_k^{th}$ matrix is not better than the cycle length property of the (P−1)$^{th}$ matrix, obtain a $P_{k+1}^{th}$ shift factor corresponding to the to-be-replaced matrix element.

Step 305: Replace the to-be-replaced matrix element in the (P−1)$^{th}$ matrix with the $P_{k+1}^{th}$ shift factor, to generate a $P_{k+1}^{th}$ matrix.

Step 306: If a cycle length property of the $P_{k+1}^{th}$ matrix is better than the cycle length property of the (P−1)$^{th}$ matrix, use the $P_{k+1}^{th}$ shift factor as the P$^{th}$ shift factor.

A method for obtaining the $P_{k+1}^{th}$ shift factor is the same as a method for obtaining the $P_k^{th}$ shift factor.

When the cycle length property of the $P_{k+1}^{th}$ matrix is better than the cycle length property of the (P−1)$^{th}$ matrix, the $P_{k+1}^{th}$ shift factor may be used as the P$^{th}$ shift factor.

In actual use, it is likely that a value of k is already very large, but the cycle length property of the $P_{k+1}^{th}$ matrix is still not better than the cycle length property of the (P−1)$^{th}$ matrix. As a result, the P$^{th}$ matrix cannot be generated in a long time. To avoid such a situation, a maximum value b may be preset for k+1, where a value of b may be a positive integer greater than 1. If the generation device generates a total of b shift factors from a $P_1^{th}$ shift factor to a $P_b^{th}$ shift factor, but a cycle length property of none of a $P_1^{th}$ matrix set to a $P_b{}^{th}$ matrix is better than the cycle length property of the $(P-1)^{th}$ matrix, the $(P-1)^{th}$ matrix may be directly used as the $P^{th}$ matrix.

Figure 4:
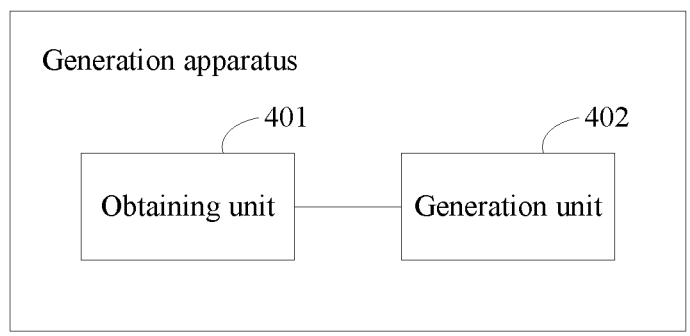
FIG. 4 is a schematic structural diagram of an embodiment of an apparatus for generating a low-density parity-check code basis matrix in this application.

Referring to FIG. 4, FIG. 4 is a schematic structural diagram of an embodiment of an apparatus for generating a low-density parity-check code basis matrix in this application.

Referring to FIG. 4, the apparatus may include an obtaining unit 401 and a generation unit 402.

The obtaining unit 401 is configured to obtain a low-density parity-check code mother matrix.

The generation unit 402 is configured to generate a $1^{st}$ matrix to a $q^{th}$ matrix one by one, where q is a preset positive integer; and the generation unit 402 may generate a $P^{th}$ matrix in the $1^{st}$ matrix to the $q^{th}$ matrix in the following manner:

selecting a to-be-replaced matrix element in a $(P-1)^{th}$ matrix, where the to-be-replaced matrix element is a matrix element having a value that is not −1 in the $(P-1)^{th}$ matrix; determining a $P^{th}$ shift factor corresponding to the to-be-replaced matrix element; and replacing the to-be-replaced matrix element in the $(P-1)^{th}$ matrix with the $P^{th}$ shift factor to obtain the $P^{th}$ matrix.

Figure 5:
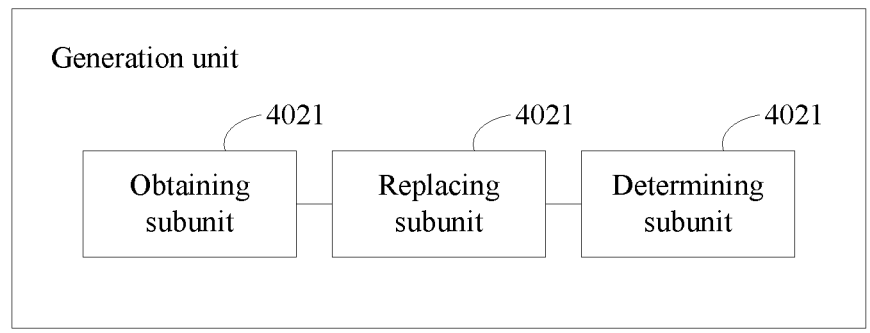
FIG. 5 is a schematic structural diagram of an embodiment of a generation unit of an apparatus for generating a low-density parity-check code basis matrix in this application.

Optionally, as shown in FIG. 5, the generation unit 402 may include an obtaining subunit 4021, a replacing subunit 4022, and a determining subunit 4023.

The obtaining subunit 4021 is configured to obtain a $P_k{}^{th}$ shift factor corresponding to the to-be-replaced matrix element. The replacing subunit 4022 is configured to replace the to-be-replaced matrix element in the $(P-1)^{th}$ matrix with the $P_k{}^{th}$ shift factor, to generate a $P_k{}^{th}$ matrix. The determining subunit 4023 is configured to: if a cycle length property of the $P_k{}^{th}$ matrix is better than a cycle length property of the $(P-1)^{th}$ matrix, use the $P_k{}^{th}$ shift factor as the $P^{th}$ shift factor.

Optionally, the obtaining subunit 4021 is further configured to: if the cycle length property of the $P_k{}^{th}$ matrix is not better than the cycle length property of the $(P-1)^{th}$ matrix, obtain a $P_{k+1}{}^{th}$ shift factor corresponding to the to-be-replaced matrix element. The replacing subunit 4022 is further configured to replace the to-be-replaced matrix element in the $(P-1)^{th}$ matrix with the $P_{k+1}{}^{th}$ shift factor, to generate a $P_{k+1}{}^{th}$ matrix. The determining subunit 4023 is further configured to: if a cycle length property of the $P_{k+1}{}^{th}$ matrix is better than the cycle length property of the $(P-1)^{th}$ matrix, use the $P_{k+1}{}^{th}$ shift factor as the $P^{th}$ shift factor.

Figure 6:
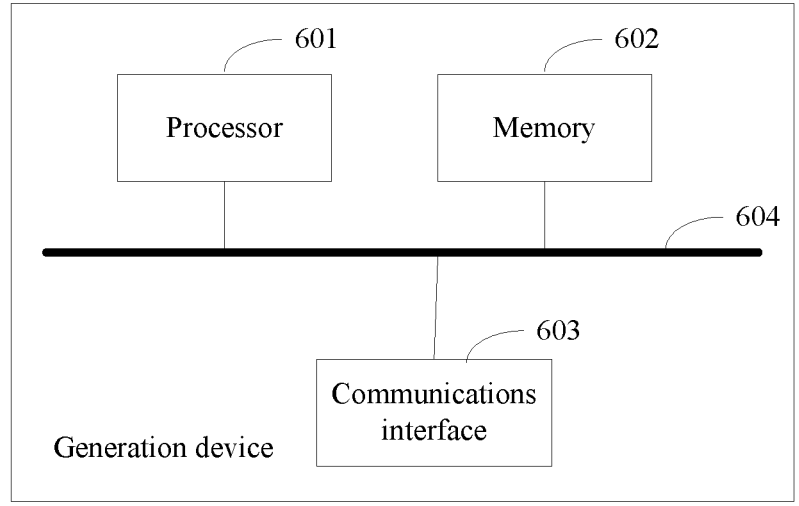
FIG. 6 is a schematic structural diagram of an embodiment of a generation device in this application.

Referring to FIG. 6, FIG. 6 is a schematic structural diagram of an embodiment of a generation device in this application.

As shown in FIG. 6, the generation device may include at least one processor 601 and at least one memory 602, and may further include, apart from the processor 601 and the memory 602, at least one communications interface 603. The processor 601, the memory 602, and the communications interface 603 are connected with each other by using one or more buses 604.

The bus 604 may be a peripheral component interconnect (peripheral component interconnect, PCI for short) bus, an extended industry standard architecture (extended industry standard architecture, EISA for short) bus, or the like. In terms of usage, the bus 604 may be classified into an address bus, a data bus, a control bus, and the like.

The processor 601 may be a central processing unit (central processing unit, CPU for short), a network processor (network processor, NP for short), or a combination of a CPU and an NP. The processor may further include a hardware chip. The hardware chip may be an application-specific integrated circuit (application-specific integrated circuit, ASIC for short), a programmable logic device (programmable logic device, PLD for short), or a combination thereof. The PLD may be a complex programmable logic device (complex programmable logic device, CPLD for short), a field-programmable gate array (field-programmable gate array, FPGA for short), a generic array logic (generic array logic, GAL for short), or any combination thereof.

The memory 602 may include a volatile memory (volatile memory) such as a random access memory (random access memory, RAM for short); the memory may include a non-volatile memory (non-volatile memory) such as a flash memory (flash memory), a hard disk drive (hard disk drive, HDD for short), or a solid-state drive (solid-state drive, SSD for short); or the memory may include a combination of the foregoing types of memories.

The communications interface 603 is used by the generation device to communicate with another device. The communications interface may be a wired communications interface, a wireless communications interface, or a combination thereof, where the wired communications interface may be, for example, an Ethernet interface. The Ethernet interface may be an optical interface, an electrical interface, or a combination thereof. The wireless communications interface may be a wireless local area network (wireless local area network, WLAN for short) interface, a cellular network communications interface, or a combination thereof.

In this application, the processor 601 is configured to obtain a low-density parity-check code mother matrix, and generate a $1^{st}$ matrix to a $q^{th}$ matrix one by one, where q is a preset positive integer; and the processor 601 may generate a $P^{th}$ matrix in the $1^{st}$ matrix to the $q^{th}$ matrix in the following manner: selecting a to-be-replaced matrix element in a $(P-1)^{th}$ matrix, where the to-be-replaced matrix element is a matrix element having a value that is not −1 in the $(P-1)^{th}$ matrix; determining a $P^{th}$ shift factor corresponding to the to-be-replaced matrix element; and replacing the to-be-replaced matrix element in the $(P-1)^{th}$ matrix with the $P^{th}$ shift factor to obtain the $P^{th}$ matrix.

When obtaining the mother matrix, the processor 601 may obtain the mother matrix from another device by using the communications interface, or the processor 601 may obtain the mother matrix from the memory, or the processor 601 may generate the mother matrix according to a preset generation rule.

Optionally, the processor 601 may be further configured to: obtain a $P_k{}^{th}$ shift factor corresponding to the to-be-replaced matrix element; replace the to-be-replaced matrix element in the $(P-1)^{th}$ matrix with the $P_k{}^{th}$ shift factor, to generate a $P_k{}^{th}$ matrix; and if a cycle length property of the $P_k{}^{th}$ matrix is better than a cycle length property of the $(P-1)^{th}$ matrix, use the $P_k{}^{th}$ shift factor as the $P^{th}$ shift factor.

Optionally, the processor 601 may be further configured to: if the cycle length property of the $P_k{}^{th}$ matrix is not better than the cycle length property of the $(P-1)^{th}$ matrix, obtain a $P_{k+1}{}^{th}$ shift factor corresponding to the to-be-replaced matrix element; replace the to-be-replaced matrix element in the $(P-1)^{th}$ matrix with the $P_{k+1}{}^{th}$ shift factor, to generate a $P_{k+1}{}^{th}$ matrix; and if a cycle length property of the $P_{k+1}{}^{th}$ matrix is better than the cycle length property of the $(P-1)^{th}$ matrix, use the $P_{k+1}{}^{th}$ shift factor as the $P^{th}$ shift factor.

After the basis matrix is generated, the generation device may communicate with another device by using the basis matrix, or may send the basis matrix to another device, so that the another device can use the basis matrix to perform data transmission.

In specific implementation, this application further provides a computer storage medium, where the computer storage medium may store a program, and when the program is executed, a part or all of the steps of the embodiments of the method for generating a low-density parity-check code basis matrix in this application may be performed. The storage medium may be a magnetic disk, an optical disc, a read-only memory (English: read-only memory, ROM for short), a random access memory (English: random access memory, RAM for short), or the like.

A person skilled in the art may clearly understand that, the technologies in the embodiments of this application may be implemented by software and a necessary general hardware platform. Based on such an understanding, the technical solutions in the embodiments of this application essentially or the part contributing to the prior art may be implemented in a form of a software product. The software product may be stored in a storage medium, such as a ROM/RAM, a hard disk, or an optical disc, and includes several instructions for instructing a computer device (which may be a personal computer, a server, a network device, or the like) to perform the methods described in the embodiments or some parts of the embodiments of this application.

For same or similar parts of the embodiments in the specification, reference may be made to each other. Especially, apparatus and device embodiments are basically similar to a method embodiment, and therefore are described briefly. For related parts, refer to descriptions in the method embodiment.

The foregoing implementation manners of this application are not intended to limit the protection scope of this application.

What is claimed is:

1. A method for generating a low-density parity-check code basis matrix, comprising:
    obtaining a low-density parity-check code mother matrix;
    setting the low-density parity-check code mother matrix as a $0^{th}$ matrix;
    generating a $1^{st}$ matrix to a $q^{th}$ matrix one by one, wherein q is a preset positive integer, and wherein a $P^{th}$ matrix in the $1^{st}$ matrix to the $q^{th}$ matrix is generated in the following manner:
        selecting a to-be-replaced matrix element in a $(P-1)^{th}$ matrix, wherein the to-be-replaced matrix element is a matrix element having a value that is not −1 in the $(P-1)^{th}$ matrix;
        determining a $P^{th}$ shift factor corresponding to the to-be-replaced matrix element in the $(P-1)^{th}$ matrix; and
        replacing the to-be-replaced matrix element in the $(P-1)^{th}$ matrix with the $P^{th}$ shift factor to obtain the $P^{th}$ matrix, wherein:
            a cycle length property of the $P^{th}$ matrix is better than a cycle length property of the $(P-1)^{th}$ matrix, wherein that the cycle length property of the $P^{th}$ matrix is better than the cycle length property of the $(P-1)^{th}$ matrix comprises:
                quantities of 4-cycles to L-cycles with an approximate cycle extrinsic message degree (ACE) being less than a first preset value in the $P^{th}$ matrix set are respectively the same as quantities of 4-cycles to L-cycles with the ACE being less than the first preset value in the $(P-1)^{th}$ matrix set, quantities of 4-cycles to L-cycles in the $P^{th}$ matrix set are respectively the same as quantities of 4-cycles to L-cycles in the $(P-1)^{th}$ matrix set, and (L+2)-cycles with the ACE being less than a second preset value in the $P^{th}$ matrix set are fewer than (L+2)-cycles with the ACE being less than the second preset value in the $(P-1)^{th}$ matrix set, wherein L is an even number less than a preset value; or
                quantities of 4-cycles to L-cycles in the $P^{th}$ matrix set are respectively the same as quantities of 4-cycles to L-cycles in the $(P-1)^{th}$ matrix set, quantities of 4-cycles to (L+2)-cycles with an approximate cycle extrinsic message degree (ACE) being less than a second preset value in the $P^{th}$ matrix set are respectively the same as quantities of 4-cycles to (L+2)-cycles with the ACE being less than the second preset value in the $(P-1)^{th}$ matrix set, and (L+2)-cycles in the $P^{th}$ matrix set are fewer than (L+2)-cycles in the $(P-1)^{th}$ matrix set, wherein L is an even number less than a preset value;
            the cycle length property of the $P^{th}$ matrix is determined by cycle length properties of matrices comprised in a $P^{th}$ matrix set, and the $P^{th}$ matrix set comprises matrices obtained by expanding the $P^{th}$ matrix based on preset lifting factors; and
            the cycle length property of the $(P-1)^{th}$ matrix is determined by cycle length properties of matrices comprised in a $(P-1)^{th}$ matrix set, and the $(P-1)^{th}$ matrix set comprises matrices obtained by expanding the $(P-1)^{th}$ matrix based on the preset lifting factors;
    setting the $q^{th}$ matrix as the low-density parity-check code basis matrix;
    constructing a parity check matrix based on the low-density parity-check code basis matrix; and
    performing parity check in data transmission based on the parity check matrix.

2. The method according to claim 1, wherein the determining a $P^{th}$ shift factor corresponding to a to-be-replaced matrix element in the $(P-1)^{th}$ matrix comprises:
    obtaining a $P_k^{th}$ shift factor corresponding to the to-be-replaced matrix element in the $(P-1)^{th}$ matrix;
    replacing the to-be-replaced matrix element in the $(P-1)^{th}$ matrix with the $P_k^{th}$ shift factor to generate a $P_k^{th}$ matrix; and
    if a cycle length property of the $P_k^{th}$ matrix is better than the cycle length property of the $(P-1)^{th}$ matrix, using the $P_k^{th}$ shift factor as the $P^{th}$ shift factor.

3. The method according to claim 2, further comprising:
    if the cycle length property of the $P_k^{th}$ matrix is not better than the cycle length property of the $(P-1)^{th}$ matrix, obtaining a $P_{k+1}^{th}$ shift factor corresponding to the to-be-replaced matrix element in the $(P-1)^{th}$ matrix;
    replacing the to-be-replaced matrix element in the $(P-1)^{th}$ matrix with the $P_{k+1}^{th}$ shift factor to generate a $P_{k+1}^{th}$ matrix; and
    if a cycle length property of the $P_{k+1}^{th}$ matrix is better than the cycle length property of the $(P-1)^{th}$ matrix, using the $P_{k+1}^{th}$ shift factor as the $P^{th}$ shift factor.

4. An apparatus for generating a low-density parity-check code basis matrix, comprising:
    a memory; and
    at least one processor, the at least one processor configured to:
        obtain a low-density parity-check code mother matrix;
        set the low-density parity-check code mother matrix as a $0^{th}$ matrix;
        generate a $1^{st}$ matrix to a $q^{th}$ matrix one by one, wherein q is a preset positive integer, and wherein a $P^{th}$ matrix in the $1^{st}$ matrix to the $q^{th}$ matrix is generated in the following manner:

selecting a to-be-replaced matrix element in a $(P-1)^{th}$ matrix, wherein the to-be-replaced matrix element is a matrix element with a value not being −1 in the $(P-1)^{th}$ matrix;

determining a $P^{th}$ shift factor corresponding to the to-be-replaced matrix element in the $(P-1)^{th}$ matrix; and replacing the to-be-replaced matrix element in the $(P-1)^{th}$ matrix with the $P^{th}$ shift factor to obtain the $P^{th}$ matrix, wherein:

a cycle length property of the $P^{th}$ matrix is better than a cycle length property of the $(P-1)^{th}$ matrix, wherein that the cycle length property of the $P^{th}$ matrix is better than the cycle length property of the $(P-1)^{th}$ matrix comprises:

quantities of 4-cycles to L-cycles with an approximate cycle extrinsic message degree (ACE) being less than a first preset value in the $P^{th}$ matrix set are respectively the same as quantities of 4-cycles to L-cycles with the ACE being less than the first preset value in the $(P-1)^{th}$ matrix set, quantities of 4-cycles to L-cycles in the $P^{th}$ matrix set are respectively the same as quantities of 4-cycles to L-cycles in the $(P-1)^{th}$ matrix set, and (L+2)-cycles with the ACE being less than a second preset value in the $P^{th}$ matrix set are fewer than (L+2)-cycles with the ACE being less than the second preset value in the $(P-1)^{th}$ matrix set, wherein L is an even number less than a preset value; or quantities of 4-cycles to L-cycles in the $P^{th}$ matrix set are respectively the same as quantities of 4-cycles to L-cycles in the $(P-1)^{th}$ matrix set, quantities of 4-cycles to (L+2)-cycles with an approximate cycle extrinsic message degree (ACE) being less than a second preset value in the $P^{th}$ matrix set are respectively the same as quantities of 4-cycles to (L+2)-cycles with the ACE being less than the second preset value in the $(P-1)^{th}$ matrix set, and (L+2)-cycles in the $P^{th}$ matrix set are fewer than (L+2)-cycles in the $(P-1)^{th}$ matrix set, wherein L is an even number less than a preset value;

the cycle length property of the $P^{th}$ matrix is determined by cycle length properties of matrices comprised in a $P^{th}$ matrix set, and the $P^{th}$ matrix set comprises matrices obtained by expanding the $P^{th}$ matrix based on preset lifting factors; and the cycle length property of the $(P-1)^{th}$ matrix is determined by cycle length properties of matrices comprised in a $(P-1)^{th}$ matrix set, and the $(P-1)^{th}$ matrix set comprises matrices obtained by expanding the $(P-1)^{th}$ matrix based on the preset lifting factors;

set the $q^{th}$ matrix as the low-density parity-check code basis matrix;

construct a parity check matrix based on the low-density parity-check code basis matrix; and perform parity check in data transmission based on the parity check matrix.

5. The apparatus according to claim 4, wherein the at least one processor is further configured to:

obtain a $P_k^{th}$ shift factor corresponding to the to-be-replaced matrix element in the $(P-1)^{th}$ matrix;

replace the to-be-replaced matrix element in the $(P-1)^{th}$ matrix with the $P_k^{th}$ shift factor to generate a $P_k^{th}$ matrix; and if a cycle length property of the $P_k^{th}$ matrix is better than the cycle length property of the $(P-1)^{th}$ matrix, use the $P_k^{th}$ shift factor as the $P^{th}$ shift factor.

6. The apparatus according to claim 5, wherein the at least one processor is further configured to:

if the cycle length property of the $P_k^{th}$ matrix is not better than the cycle length property of the $(P-1)^{th}$ matrix, obtain a $P_{k+1}^{th}$ shift factor corresponding to the to-be-replaced matrix element in the $(P-1)^{th}$ matrix;

replace the to-be-replaced matrix element in the $(P-1)^{th}$ matrix with the $P_{k+1}^{th}$ shift factor to generate a $P_{k+1}^{th}$ matrix; and if a cycle length property of the $P_{k+1}^{th}$ matrix is better than the cycle length property of the $(P-1)^{th}$ matrix, use the $P_{k+1}^{th}$ shift factor as the $P^{th}$ shift factor.

* * * * *